United States Patent
Amon et al.

(10) Patent No.: US 7,259,060 B2
(45) Date of Patent: Aug. 21, 2007

(54) METHOD FOR FABRICATING A SEMICONDUCTOR STRUCTURE

(75) Inventors: Jürgen Amon, Dresden (DE); Jürgen Faul, Radebeul (DE); Johann Alsmeier, Ottobrunn (DE); Matthias Goldbach, Dresden (DE); Albrecht Kieslich, Radebeul (DE); Ralf Müller, Dresden (DE); Dirk Offenberg, Kleve-Kellen (DE); Thomas Schuster, Dresden (DE)

(73) Assignee: Infineon Technologies AG, Munich (DE)

( * ) Notice: Subject to any disclaimer, the term of this patent is extended or adjusted under 35 U.S.C. 154(b) by 306 days.

(21) Appl. No.: 10/995,677

(22) Filed: Nov. 23, 2004

(65) Prior Publication Data

US 2005/0124124 A1    Jun. 9, 2005

(30) Foreign Application Priority Data

Dec. 3, 2003   (DE) ............................. 103 56 476

(51) Int. Cl.
  *H01L 21/8242* (2006.01)

(52) U.S. Cl. .................... 438/243; 438/302; 438/306; 438/386; 438/528; 438/530

(58) Field of Classification Search ............... 438/243, 438/302, 305, 306, 386, 525, 528, 530
See application file for complete search history.

(56) References Cited

U.S. PATENT DOCUMENTS

| 6,238,967 B1 * | 5/2001 | Shiho et al. ............. 438/244 |
| 6,444,548 B2 | 9/2002 | Divakaruni et al. |
| 2001/0046745 A1 * | 11/2001 | Divakaruni et al. ....... 438/306 |

FOREIGN PATENT DOCUMENTS

DE        102 40 429 A1    3/2004

* cited by examiner

*Primary Examiner*—Zandra V. Smith
*Assistant Examiner*—Toniae M. Thomas
(74) *Attorney, Agent, or Firm*—Laurence A. Greenberg; Werner H. Stemer; Ralph E. Locher

(57) ABSTRACT

A method fabricates a semiconductor structure having a plurality of memory cells that are provided in a semiconductor substrate of a first conductivity type and contains a plurality of planar selection transistors and a corresponding plurality of storage capacitors connected thereto. The selection transistors have respective first and second active regions of a second conductivity type. The first active regions are connected to the storage capacitors and the second active regions are connected to respective bit lines, and respective gate stacks, which are provided above the semiconductor substrate in a manner insulated by a gate dielectric. In this case, a single-sided halo doping is effected, and an excessive outdiffusion of the halo doping zones is prevented by introduction of a diffusion-inhibiting species.

10 Claims, 10 Drawing Sheets

METHOD FOR FABRICATING A SEMICONDUCTOR STRUCTURE

BACKGROUND OF THE INVENTION

Field of the Invention

The present invention relates to a method for fabricating a semiconductor structure having a plurality of memory cells that are provided in a semiconductor substrate of a first conductivity type. The memory cells contain a plurality of planar selection transistors and a corresponding plurality of storage capacitors connected thereto. The selection transistors have respective first and second active regions of the second conductivity type. The first active regions are connected to the storage capacitors and the second active regions are connected to respective bit lines, and respective gate stacks, are provided above the semiconductor substrate in a manner insulated by a gate dielectric.

Planar selection transistors for DRAM memory devices encounter technological limits at gate lengths of less than 100 nm since, on the one hand, an adequate turn-off behavior of the transistors fabricated has to be guaranteed and, on the other hand, the electric fields that occur in the junction region have to be low in a controlled fashion.

In the case of logic transistors, by contrast, very high channel or halo droppings that are necessary for preventing a punch-through, as a result of high field strengths that occur, lead to problems in terms of the reliability at the drain side. Furthermore, the series resistances at the source and drain side of the semiconductor device, or of the device, increase as a result of the high droppings.

In this connection, Published, Non-Prosecuted German Patent Application DE 102 40 429 proposed introducing a single-sided doping (also referred to as halo implantation) into the selection transistors (e.g. boron for an n-channel transistor), to be precise in a self-aligned manner with respect to the gate edge after the fabrication of the gate stack. In the case of a memory technology, this is effected—depending on the layout of the cell—e.g. by a corresponding photomask on which that side of the device that is to be implanted is exposed. Thus, by way of example, a strip mask is used for a layout realized in a MINT cell, whereas no mask or a perforated mask is required in the case of a checkerboard layout.

However, in the case of DRAM fabrication, the halo implantation is succeeded by numerous thermal process steps that bring about an outdiffusion of the halo implantation zones. As long as the concentration due to outdiffusion does not become too high in the active terminal zone on the side of the storage capacitor, it is not disturbing with regard to field-induced leakage currents at the capacitor-transistor junction. However, the risk of the undesired increase in concentration at the active terminal zone on the side of the storage capacitor becomes ever greater with increasing dimensional miniaturization. Disadvantages that then occur include a reduction of the retention time on account of undesired leakage currents from the storage capacitor to the halo implantation zone or to the bit line.

SUMMARY OF THE INVENTION

It is accordingly an object of the invention to provide a method for fabricating a semiconductor structure that overcomes the above-mentioned disadvantages of the prior art methods of this general type, which improves the scalability of planar array selection transistors with halo implantation zones, in particular for gate lengths of less than 100 nm.

With the foregoing and other objects in view there is provided, in accordance with the invention, a method for fabricating a semiconductor structure containing a plurality of memory cells having a plurality of planar selection transistors and a corresponding plurality of storage capacitors connected thereto. The selection transistors have respective first and second active regions of a second conductivity type. The first active regions are connected to the storage capacitors and the second active regions are connected to bit lines. Gate stacks are provided above the semiconductor substrate in a manner insulated by a gate dielectric. The method includes the steps of providing a semiconductor substrate of a first conductivity type, forming the storage capacitors in the semiconductor substrate, providing the gate dielectric above the semiconductor substrate, forming the gate stacks on the gate dielectric, and carrying out a first introduction step for introducing first doping regions of the first conductivity type in a self-aligned manner with respect to edges of the gate stacks on a side of the second active regions for increasing a doping of a channel region of the selection transistors being spaced apart from the first active regions. A second introduction step is carried out for introducing second doping regions, which counteract a thermal outdiffusion of the first doping regions in a direction of the first active regions. The first and second active regions are provided in a self-aligned manner with respect to the edges of the gate stacks.

What is advantageous about the method of the invention for fabricating a semiconductor structure is that a further miniaturization of DRAM memory cells becomes possible, thereby establishing a cost advantage.

One idea on which the invention is based relates to preventing the excessive outdiffusion of the halo implantation zones by introducing a diffusion-inhibiting species or species that causes defect trapping.

In accordance with one preferred development, the first introduction step and/or the second introduction step are implantation steps.

In accordance with a further preferred development, the first doping regions are boron regions and the second doping regions are nitrogen and/or carbon regions, which are preferably produced by respective implantations. A plurality of co-implantations of nitrogen and/or carbon regions are also possible in this case.

In accordance with a further preferred development, a sidewall oxide is formed on uncovered sidewalls of the gate stacks with diffused first and second doping regions simultaneously being formed below the gate edge.

In accordance with a further preferred development, the gate stacks are applied approximately equidistantly with respect to one another, a storage capacitor being disposed below every second adjacent gate stack in the semiconductor substrate.

In accordance with a further preferred development, the gate stacks are applied approximately equidistantly with respect to one another, a storage capacitor is disposed alternately below every third or first adjacent gate stack in the semiconductor substrate.

In accordance with a further preferred development, diffused first and second doping regions are formed by a separate heat treatment step set in a predetermined manner.

In accordance with a further preferred development, the gate stacks are fabricated with a linear spacing of less than 100 nm.

In accordance with a further preferred development, the gate stacks are provided in a parallel, strip-type manner on the semiconductor substrate.

Other features which are considered as characteristic for the invention are set forth in the appended claims.

Although the invention is illustrated and described herein as embodied in a method for fabricating a semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a semiconductor structure after preceding elementary steps in the fabrication process. In a semiconductor substrate 1, storage capacitors TK1, TK2, TK3 and TK4 are disposed vertically with respect to the surface of the semiconductor substrate 1. A dielectric 5 is applied above the semiconductor substrate 1, and serves for passivating the semiconductor substrate 1. A multiplicity of gate stacks GS1 to GS8 are applied approximately equidistantly on the gate dielectric 5, each gate stack preferably being provided in three layers 10, 20 and 30 patterned identically. The first gate stack layer 10, which directly adjoins the gate dielectric 5, preferably has polysilicon. It is adjoined above it by a second gate stack layer 20, which is formed of a metal silicide, in particular, and is followed by a third gate stack layer 30, which preferably has silicon nitride. The gate stacks GS1 to GS8 preferably extend in a parallel and strip-type manner in the plane of the drawing and have essentially the same dimensions.

Figure 1:
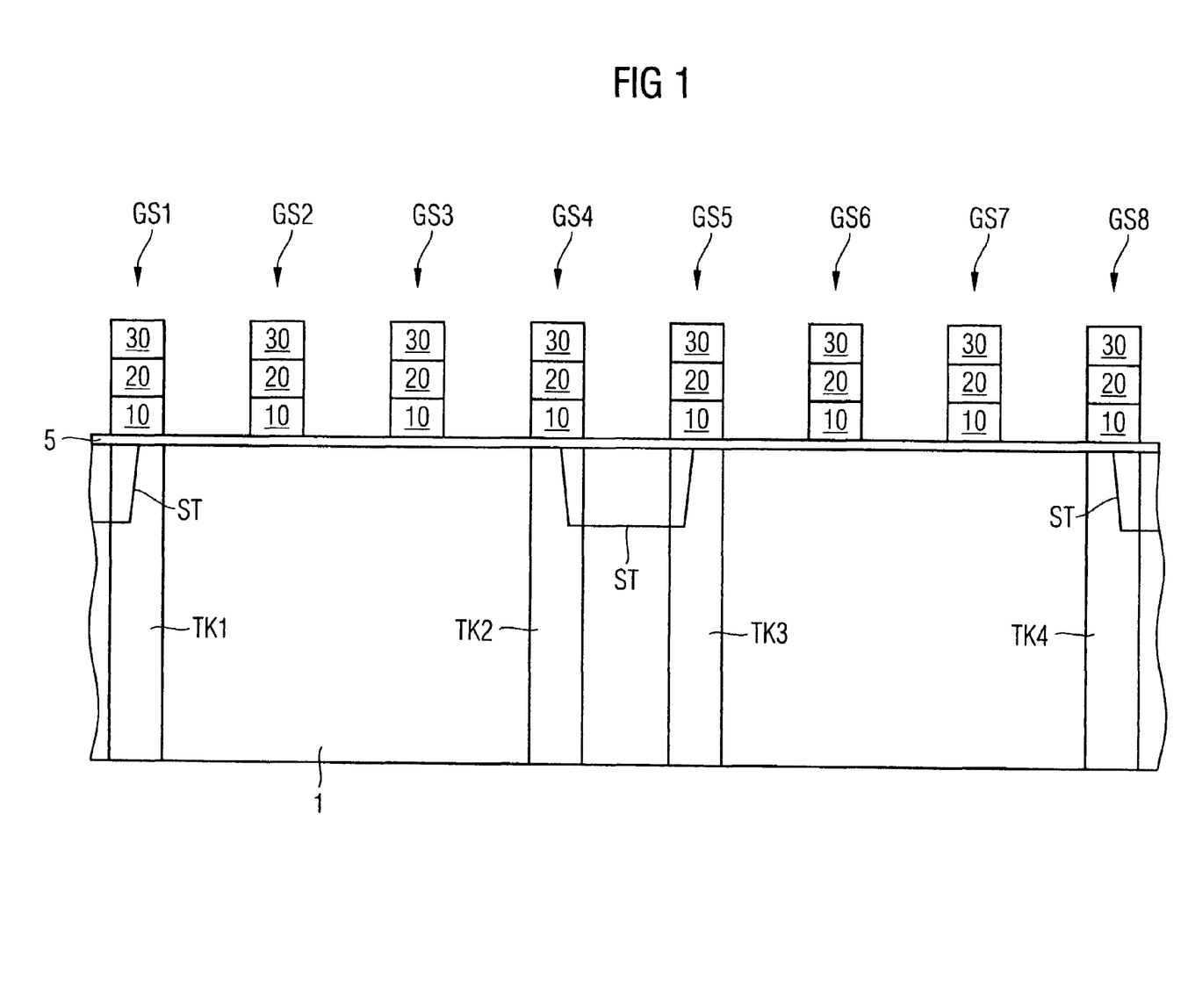
FIGS. 1 to 5 are diagrammatic, sectional views illustrating successive stages in a fabrication method for elucidating a first embodiment of the invention.

In FIG. 1, ST designates shallow trench isolation (STI) trenches that isolate the cells from one another. For reasons of clarity, the STI trenches are not mentioned further hereinafter, nor are they illustrated in the further drawings.

In accordance with the first present embodiment, the storage capacitors TK1, TK2, TK3 and TK4 are disposed in such a way that alternately in each case every third or first gate stack GS1, GS4, GS5 and GS8 is located above a capacitor TK1, TK2, TK3, TK4.

Figure 2:
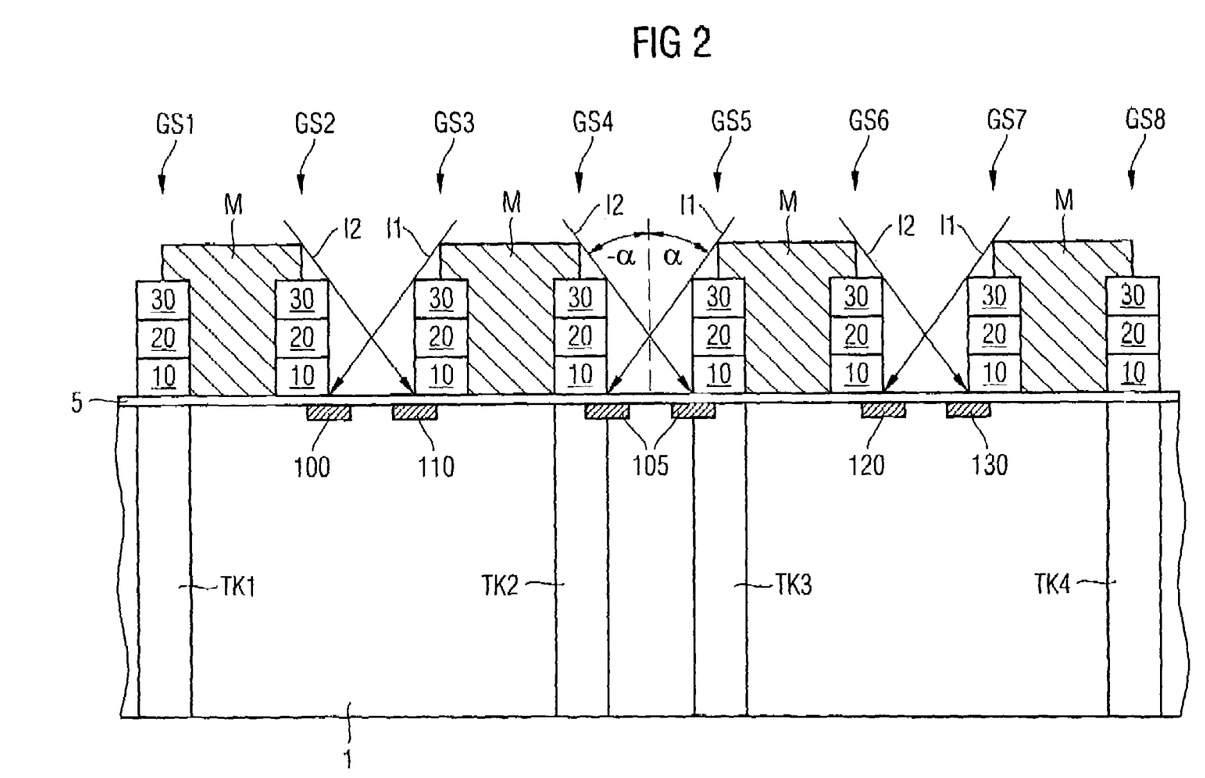

FIG. 2 illustrates the semiconductor structure in accordance with FIG. 1 in a subsequent stage of the fabrication process. A mask M, preferably patterned photolithographically, is provided between every second laterally adjacent gate stack pair GS1, GS2; GS3, GS4; GS5, GS6; GS7, GS8. A mask section M being disposed between two gate stacks, e.g. GS1 and GS2, and one of the gate stacks GS1 lying above a capacitor TK1, whereas the laterally adjacent gate stack GS2 is not disposed above a storage capacitor. Such a mask section M preferably extends in the vertical direction beyond the gate stacks, e.g. GS1, GS2, and is patterned in terms of width in such a way that an implantation beam used from a predetermined direction I1, I2 for doping the semiconductor substrate 1 in the regions not covered by the mask is not impaired by the mask or the mask sections M.

In accordance with the first embodiment of the present invention, a dopant is implanted into the semiconductor substrate 1 in regions not covered by the mask sections M. The implantation I1, I2 being effected from one or two predetermined directions and, accordingly, doping regions 100, 110, 105, 120, 130 preferably being formed in a self-aligned manner with respect to the gate edge in the semiconductor substrate 1.

The directions of the implantations I1, I2 form with the vertical an angle $\alpha$ and $-\alpha$, respectively, of between 0°, i.e. I1=I2, and the angle between the vertical and a straight line extending from the lower junction between gate dielectric 5 and gate stack, e.g. GS3, while touching the upper lateral outer edge of a laterally adjacent gate stack, e.g. GS2. One dopant in the case of an n-channel transistor is boron, for example, which, in accordance with the first embodiment, is introduced into the semiconductor substrate 1 using a strip mask with the mask sections M. The doping region 100, 110, 105, 120 and 130 is in each case provided only at one side or gate edge of a corresponding gate stack GS2, GS3, GS4, GS5, GS6, GS7, which leads to an asymmetrical configuration.

The regions 105 lie in the STI trenches and have no electrical function or may also be omitted by suitable masking.

Figure 3:
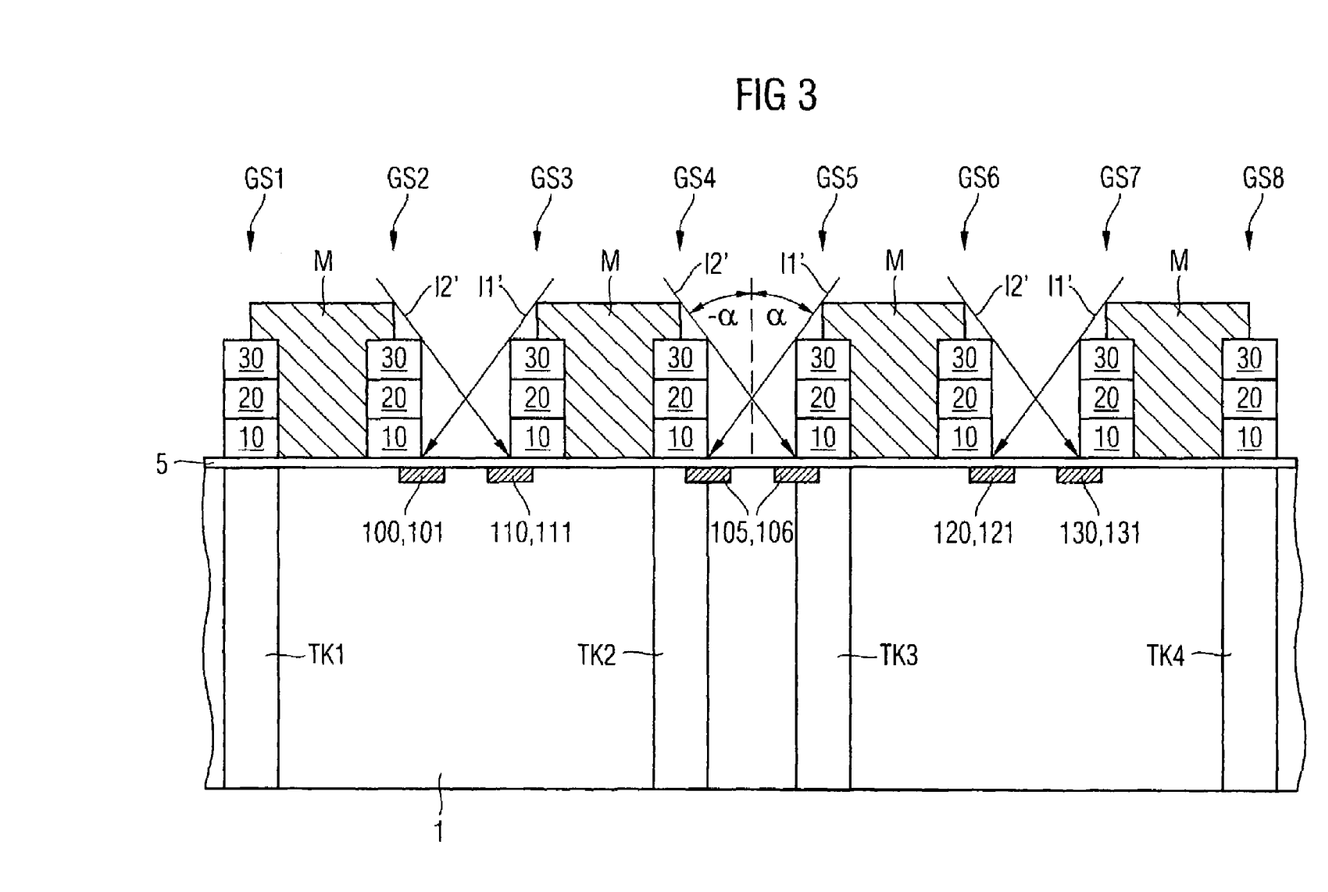

In accordance with FIG. 3, second (or else a plurality of) implantations I1', I2' are then effected directly after the first implantations I1, I2, doping regions 101, 111, 106, 121 and 131 containing a diffusion-inhibiting species, e.g. nitrogen or carbon in the case of boron, being introduced into the doping regions 100, 110, 105, 120 and 130. Doses in the range of $5\times10^{13}$ to $3\times10^{15}$ cm$^{-3}$ have proved to be effective in this case.

In this connection, it should be mentioned that, in the case of this embodiment, the implanted doping regions 101, 111, 106, 121 and 131 are illustrated as coincident with the doping regions 100, 110, 105, 120 and 130. This is not absolutely necessary, however, and a certain deviation, in particular in the direction of greater penetration depth, has not proved to be disturbing.

Figure 4:
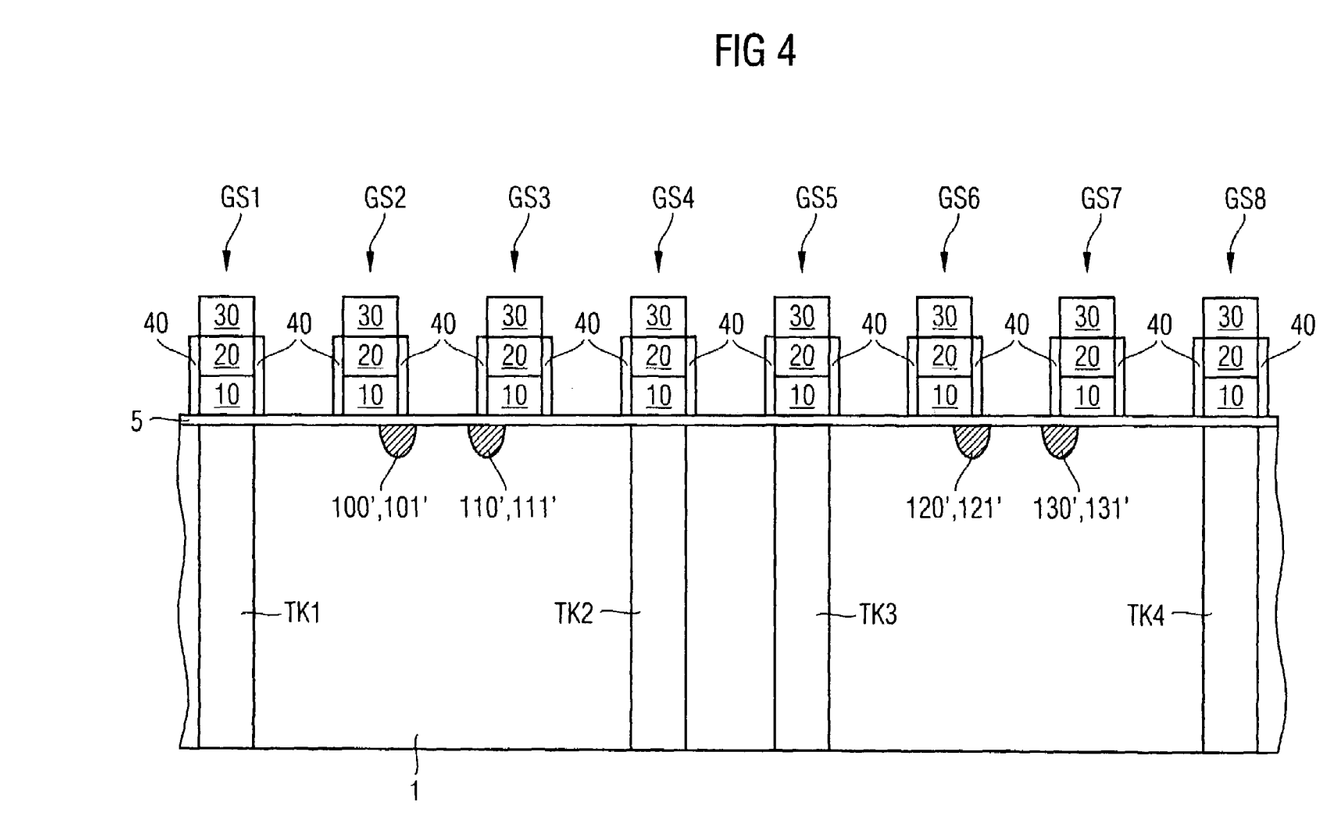

FIG. 4 shows the semiconductor structure in accordance with 0FIG. 3 after further method steps in accordance with the first embodiment of the present invention. After a stripping of the mask sections M, i.e. of the strip mask in the case of an MINT layout, a sidewall oxidation is carried out over the oxidizable sidewalls of the two lower gate stack layers 10, 20, a sidewall oxidation layer 40 thereby being formed. Altered doping regions 100', 110' 120', 130' containing boron or 101', 111', 121', 131' containing the diffusion-inhibiting species form during the sidewall oxidation that is carried out thermally. However, the outdiffusion is greatly restricted on account of the diffusion-inhibiting species.

By skillfully utilizing the segregation (depletion of the doping into the oxide that arises) into the oxide growing on the junction regions and the diffusion under the gate edge, it is possible to influence, i.e. design, the potential barrier on the source side of the device, and the junction fields (electric fields) on the drain side are greatly reduced.

Figure 5:
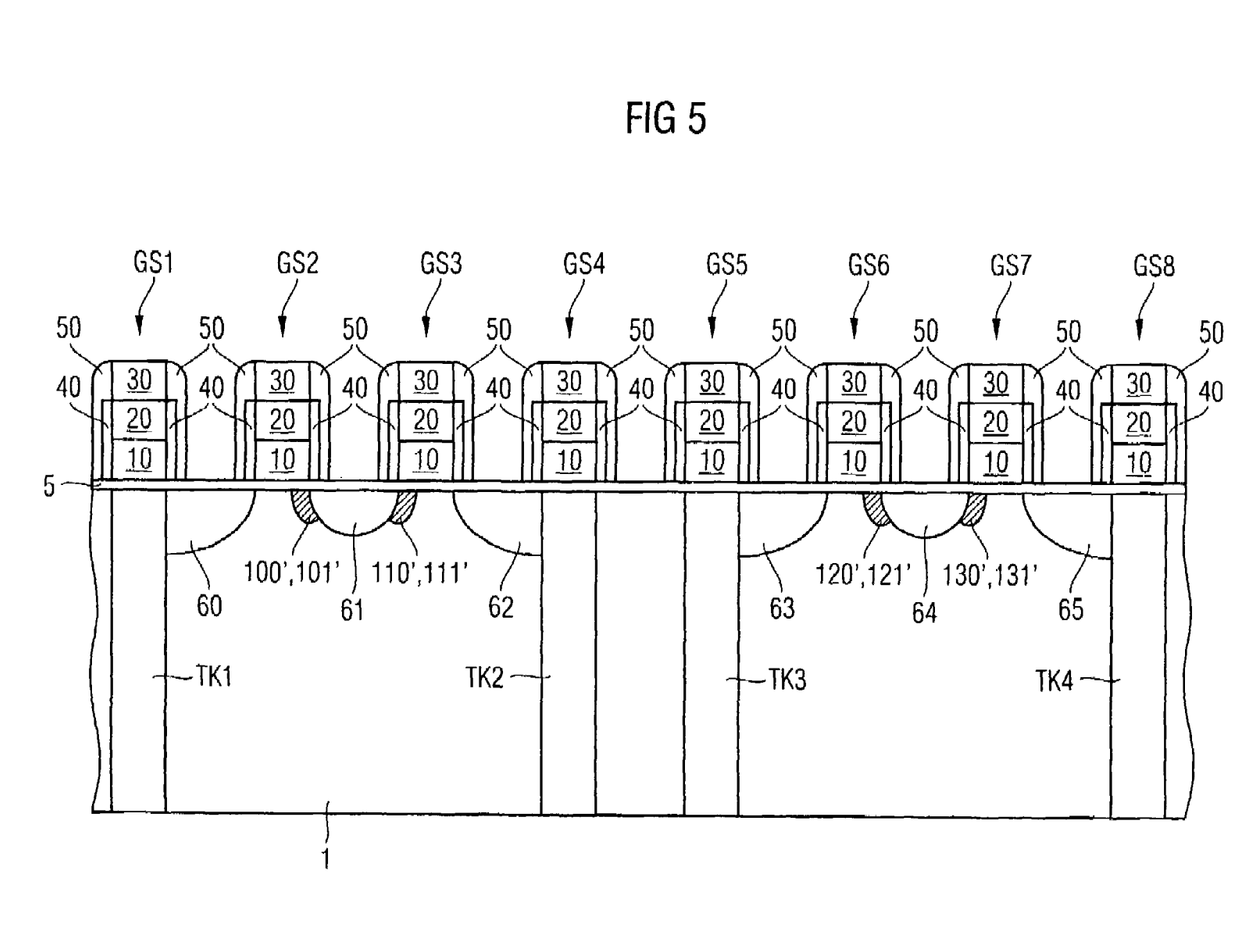

FIG. 5 illustrates a semiconductor structure in accordance with FIG. 4 after subsequent steps in the fabrication process, a sidewall spacer 50, e.g. made of silicon nitride, being applied over the sidewalls of the gate stacks GS1 to GS8 and over the sidewall oxide layers 40. Furthermore, active semiconductor regions 60, 61, 62, 63, 64 and 65 have been formed between the corresponding gate stacks GS1 to GS8. Further fabrication steps such as removal of the gate dielectric and a subsequent provision of a contact-making device (not illustrated in either case) shall be mentioned only in a supplementary fashion.

A semiconductor structure fabricated in this way with asymmetrical doping, which is adapted in terms of its concentration profile by diffusion directly before, directly after and/or during the sidewall oxidation, improves the short-channel behavior of the transistor and at the same time reduces the electric fields on the drain side of the device. The drain side is the node side with the storage capacitor in the case of a memory cell in which a logic "1" is stored as information, while it characterizes the side of the device with the higher potential in the case of a logic application. In principle, it is possible to use this method both for n- and p-FET structures or devices using corresponding species or a substrate dopant combinations, the diffusion under the gate and the segregation into the oxide growing on the source/drain region depending greatly on the dopant used.

Figure 6:
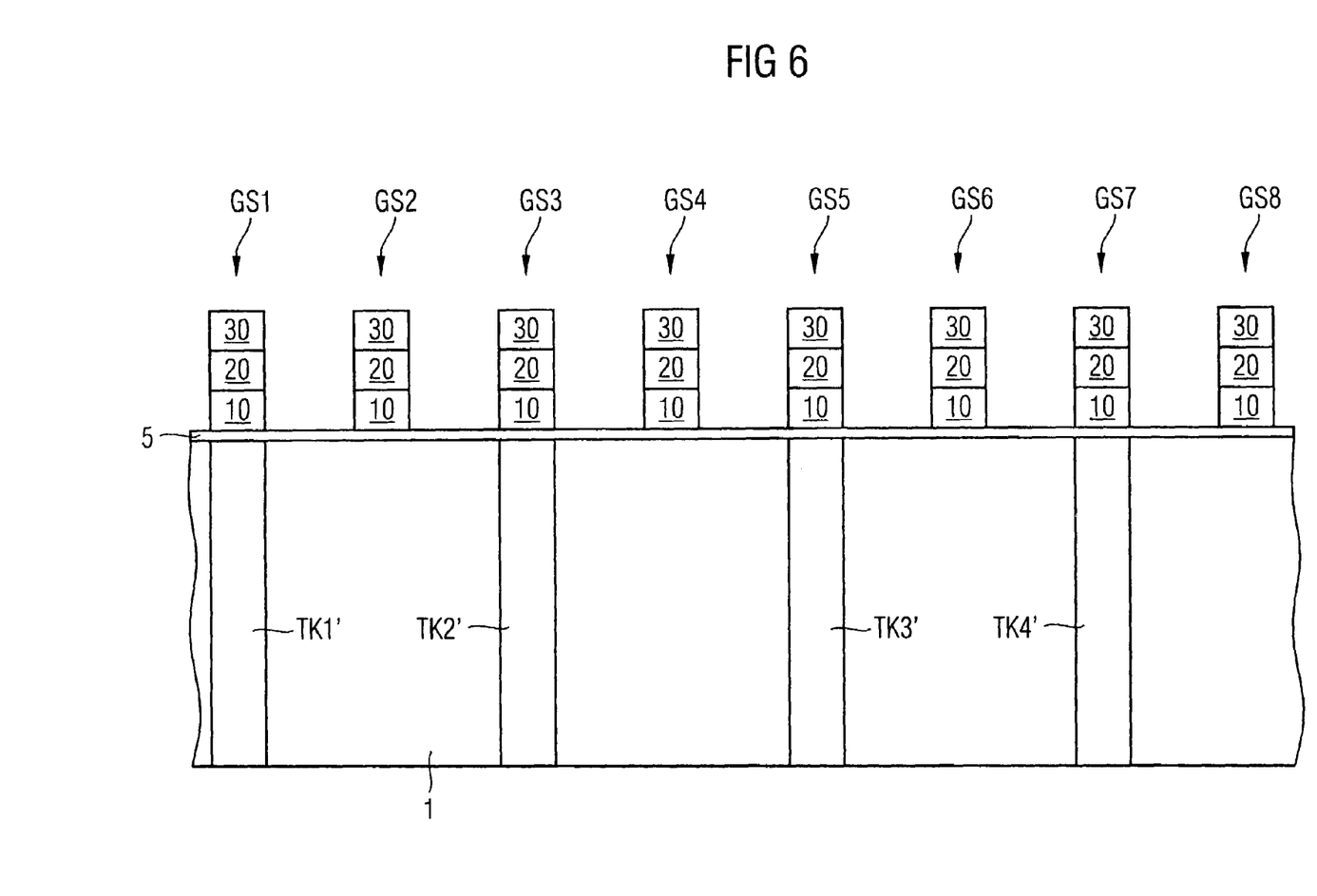
FIGS. 6 to 10 are diagrammatic, sectional views of successive stages in the fabrication method for elucidating a second embodiment of the present invention.

FIG. 6 shows a semiconductor structure which differs from the semiconductor structure in accordance with FIG. 1 in that the storage capacitors TK1', TK2', TK3' and TK4', which are disposed vertically in the semiconductor substrate 1, are provided below every second laterally adjacent gate stack GS1, GS3, GS5 and GS7. This corresponds to a checkerboard layout.

In the case of this layout, too, it is possible to provide strip-type STI trenches, although these cannot be seen in this section.

Figure 7:
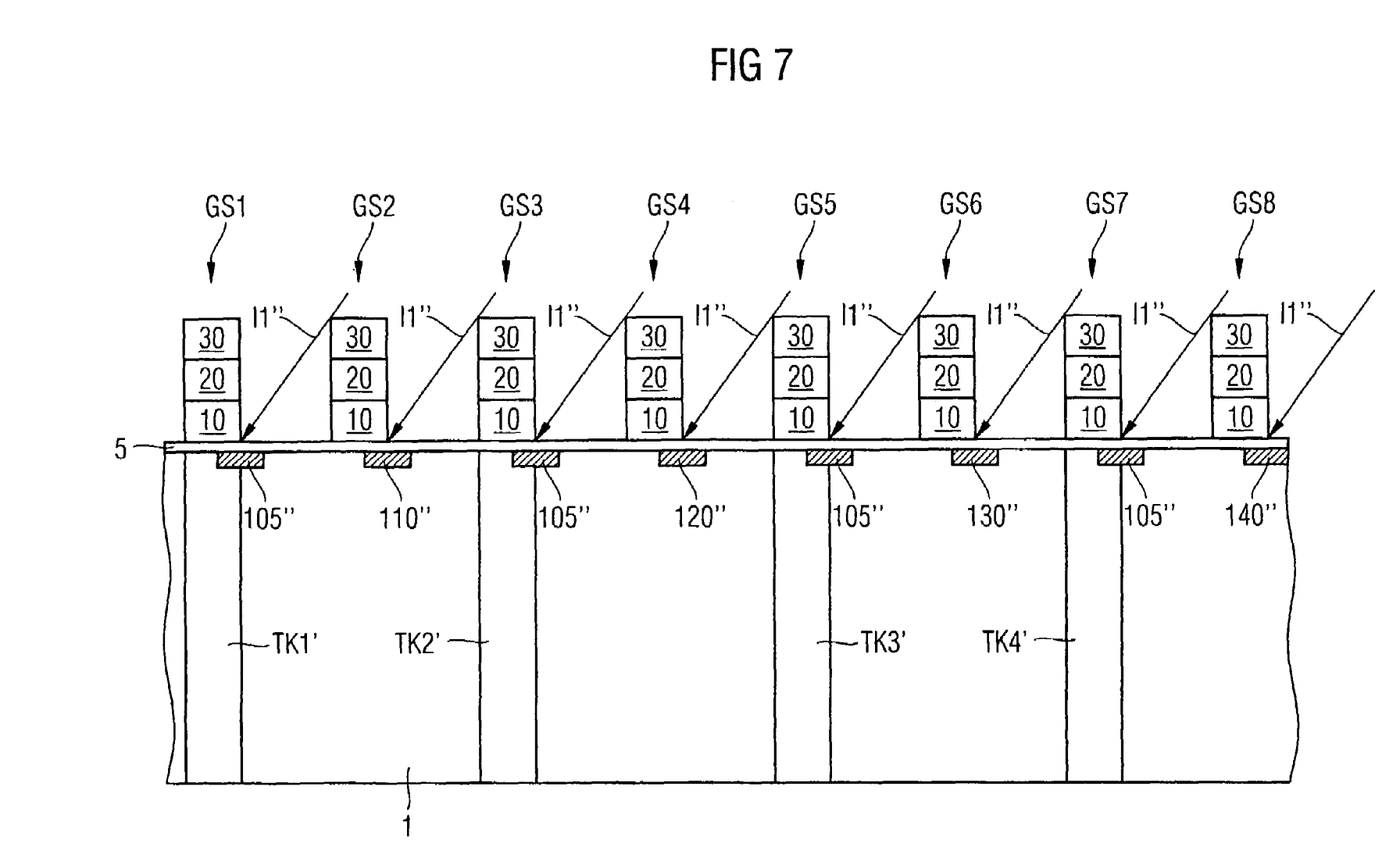

FIG. 7 illustrates the semiconductor structure in accordance with FIG. 6, doping regions 105", 110", 120", 130" and 140" being provided by an angled first implantation I1' in the semiconductor substrate 1 at the right-hand edges of the gate stacks GS1 to GS8 without the use of a mask. The explanation with reference to FIG. 2 is applicable to the predetermined implantation angle α, the implantation I1" being carried out only from one direction in accordance with this second embodiment of the present invention, to be precise, in the case of each adjacent gate stack GS1 to GS8, on the same side in the region of the junction between the gate dielectric 5 and the first gate stack layer 10 in the semiconductor substrate. In principle, the implantation may likewise be effected from the corresponding other direction (not illustrated), a negative angle α occurring and the other edge region of each gate stack GS1 to GS8 being provided with a corresponding doping at the junction between the gate dielectric 5 and the first gate stack layer 10 in the semiconductor substrate 1.

Figure 8:
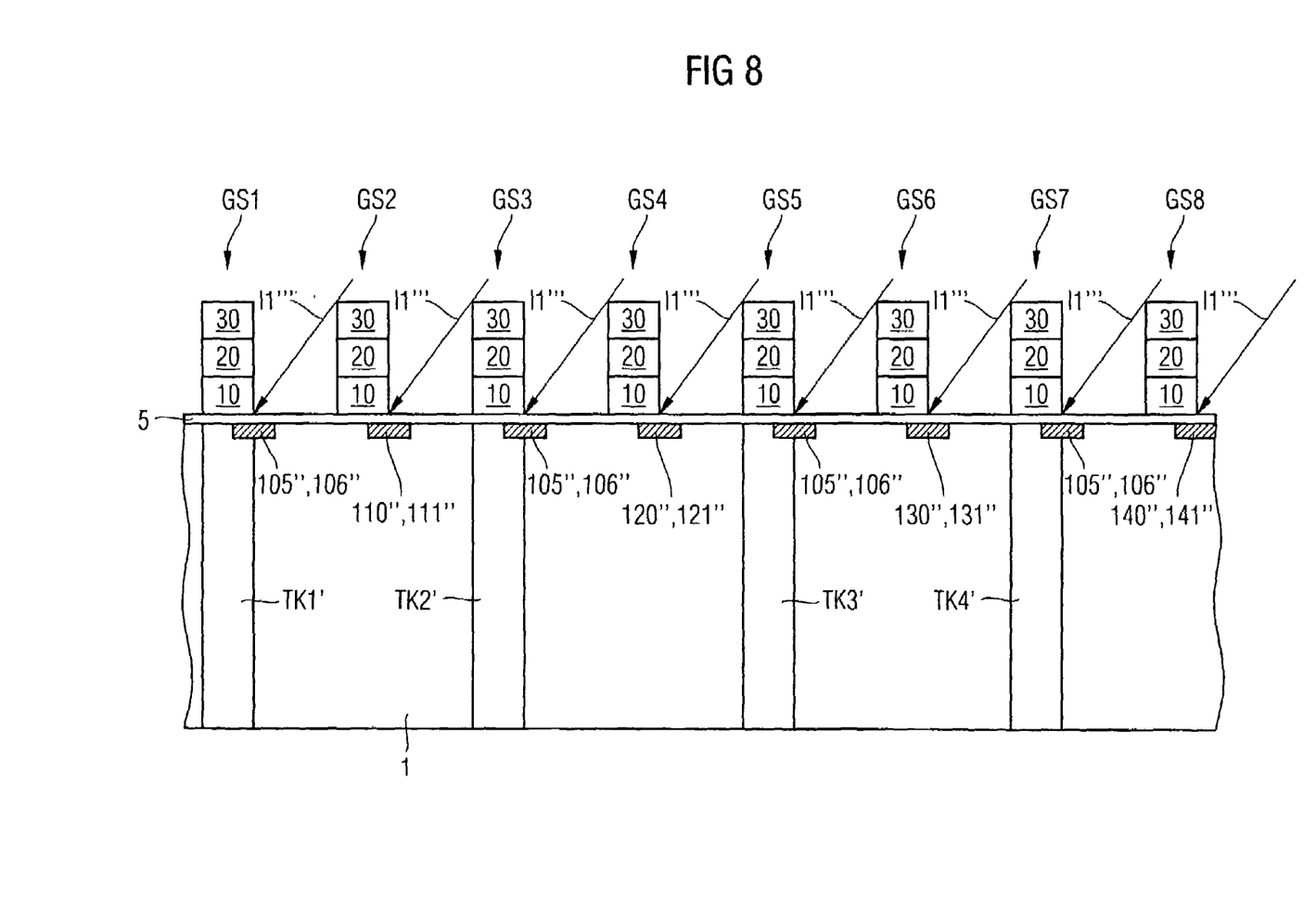

In accordance with FIG. 8, a second implantations I1'" is then effected directly after the first implantations I", implanted doping regions 106", 111", 121", 131" and 141" containing a diffusion-inhibiting species, e.g. nitrogen or carbon in the case of boron, being introduced into the doping regions 105", 110", 120", 130" and 140" analogously to the first embodiment above.

Figure 9:
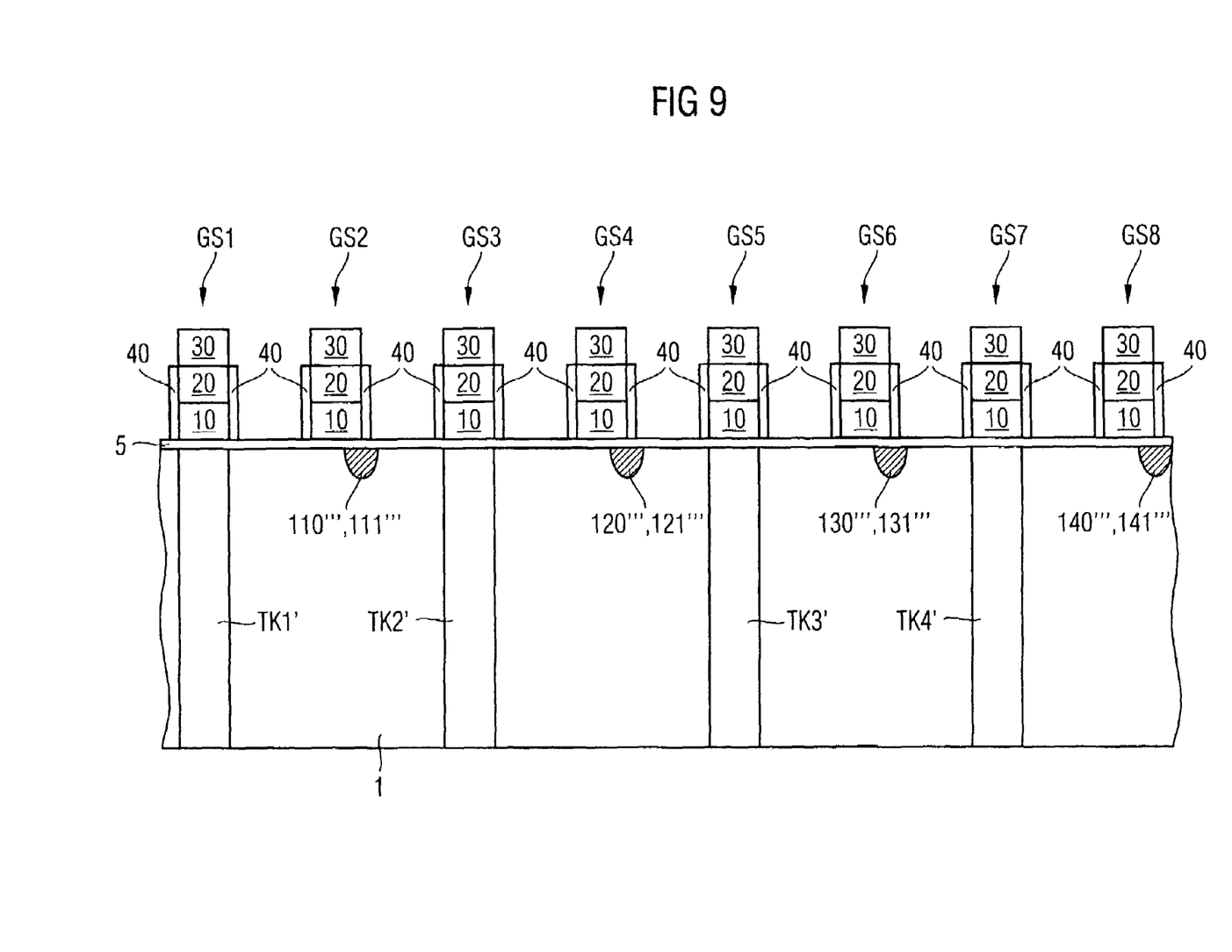

FIG. 9 illustrates a configuration in accordance with FIG. 8 after subsequent process steps in the fabrication method. As described with reference to FIG. 4, a sidewall oxidation 40 is generated over the oxidizable sidewalls of the gate stacks GS1 to GS8, during which altered doping regions 110'", 120'", 130'", 140'" or 111'", 121'", 131'" and 141'" form at the gate edges of the gate stacks GS2, GS4, GS6 and GS8 which are not disposed above a storage capacitor. In this case, too, as described with reference to FIG. 4, for distributing the doping in the semiconductor substrate 1, a separate heat treatment step that is set in a targeted manner can be provided or the sidewall oxidation can be divided between two or more partial steps and the implantation of the dopant, which was explained with reference to FIGS. 6 and 7, can be implemented in between in order to generate an optimized spatial doping concentration distribution.

Figure 10:
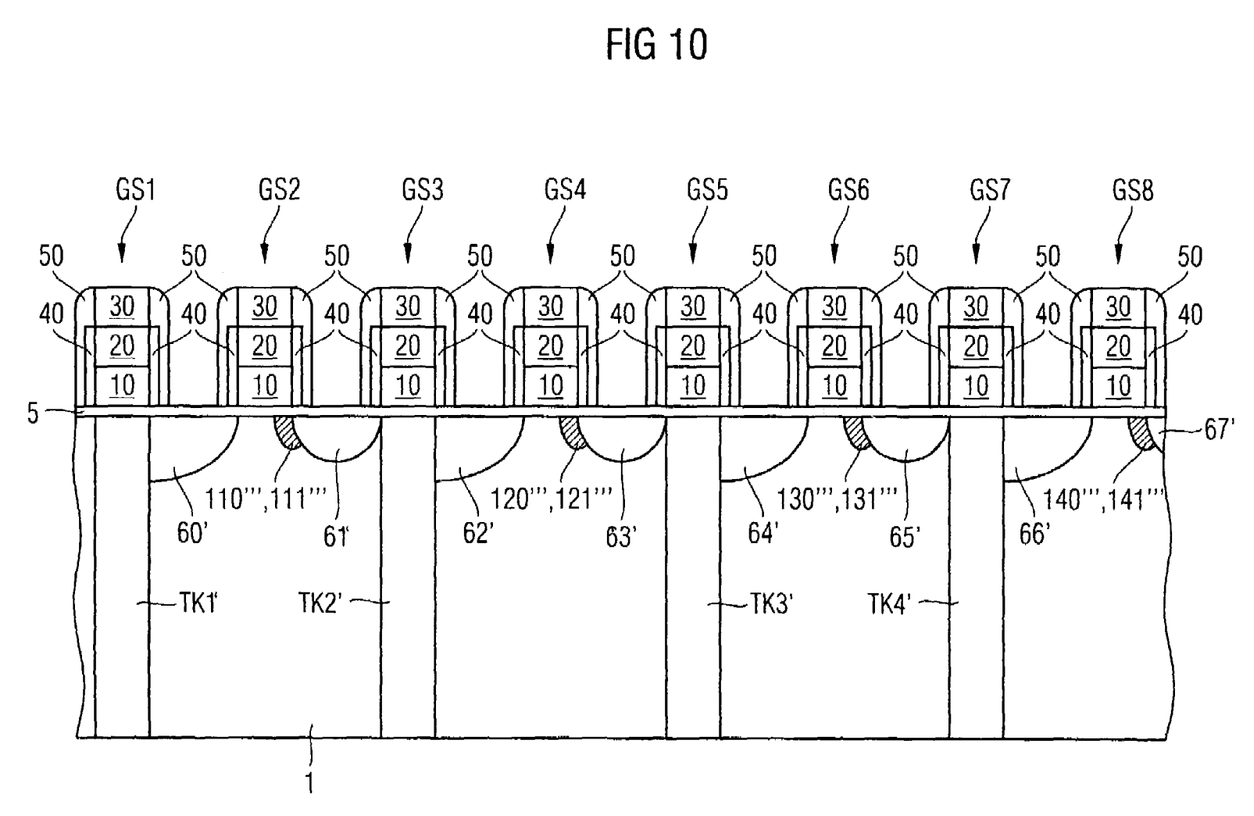

FIG. 10 illustrates a structure in accordance with FIG. 9, a sidewall spacer 50 being applied over the sidewalls and the sidewall oxide 40 of the gate stacks GS1 to GS8, the spacer preferably containing silicon nitride. In addition, active semiconductor regions 60', 61', 62', 63', 64', 65', 66' and 67' are provided, which serve for linking to an electrical contact device (not illustrated) after a subsequent removal of the gate dielectric 5 in regions between the individual gate stacks GS1 to GS8 that are not covered by the enveloped gate stack 10, 20, 30, 40 and 50.

Although the present invention has been described above on the basis of two preferred exemplary embodiments, it is not restricted thereto, but rather can be modified in diverse ways.

In particular, the layer materials for the gate stacks, the arrangement thereof and the dopant mentioned are only by way of example. Moreover, the present invention and also the object on which it is based can be applied, in principle, to any desired integrated circuits even though they have been explained with reference to integrated DRAM memories and logic circuits in silicon technology. Likewise, both n- and p-channel field-effect transistors or devices can be realized on the basis of the invention's method for fabricating a semiconductor structure.

Although only one co-implantation of nitrogen and/or carbon regions was mentioned in the examples above, it goes without saying that a plurality of co-implantations are also possible, in particular for producing specific spatial profiles.

Although the sidewall oxidation was carried out after the implantations of the halo and nitrogen and/or carbon regions and was simultaneously used for driving out the implanted species in the examples above, the implantations may also be carried out after the sidewall oxidation and additional thermal steps may be used for the drive-out.

This application claims the priority, under 35 U.S.C. § 119, of German patent application No. 103 56 476.4, filed Dec. 3, 2003; the entire disclosure of the prior application is herewith incorporated by reference.

We claim:

1. Method for fabricating a semiconductor structure having a plurality of memory cells which are provided in a semiconductor substrate (l) of a first conduction type (p) and comprise a plurality of planar selection transistors and a corresponding plurality of storage capacitors (TK1-TK4; TK1'-TK4') connected thereto, the selection transistors having respective first and second active regions (60, 61; 62, 61; 63, 64; 65, 64; 60', 61'; 62', 63'; 64', 65'; 66', 67') of the second conduction type (n), of which the first active regions (60, 62, 63, 65) are connected to the storage capacitors (TK1-TK4; TK1'-TK4') and the second active regions (61, 64, 61', 63', 65', 67') are connected to respective bit lines, and respective gate stacks (GS1-GS8), which are provided above the semiconductor substrate (1) in a manner insulated by a gate dielectric (5), having the following steps:

providing the storage capacitors (TK1-TK4; TK1'-TK4') in the semiconductor substrate (1);

providing the gate dielectric (5) above the semiconductor substrate (1);

providing the gate stacks (GS1-GS8) on the gate dielectric (5)

carrying out a first introduction step (I1, I2; I1") for introducing first doping regions (100, 105, 110, 120, 130; 105", 110", 120", 130", 140") of the first conduction type (p) in a self-aligned manner with respect to edges of the gate stacks (GS1-GS8) on the side of the second active regions (61, 64, 61', 63', 65', 67') for the purpose of increasing the doping of a channel region of the selection transistors which is spaced apart from the first active regions (60, 62, 63, 65);

carrying out a second introduction step (I1', I2'; I1''') for introducing second doping regions (101, 106, 111, 121, 131; 106", 111", 121", 131", 141"), which counteract a thermal outdiffusion of the first doping regions (100, 105, 110, 120, 130; 105", 110", 120", 130", 140") in the direction of the first active regions (60, 62, 63, 65);

providing the first and second active regions (60, 61; 62, 61; 63, 64; 65, 64; 60', 61'; 62', 63'; 64', 65'; 66', 67') in a self-aligned manner with respect to edges of the gate stacks (GS1-GS8).

2. Method according to claim 1, characterized in that the first introduction step (I1, I2; I1") and/or the second introduction step (I1', I2'; I1''') are implantation steps.

3. Method according to claim 1 or 2, characterized in that the first doping regions (100, 105, 110, 120, 130; 105", 110", 120", 130", 140") are boron regions and the second doping regions (101, 106, 111, 121, 131; 106", 111", 121", 131", 141") are nitrogen or carbon regions.

4. Method according to claim 1, 2 or 3, characterized in that a plurality of second introduction steps (I1', I21'I1''') for introducing second doping regions (101, 106, 111, 121, 131; 106', 111", 121", 131", 141") which counteract a thermal outdiffusion of the first doping regions (100, 105, 110, 120, 130; 105", 110", 120", 130", 140") in the direction of the first active regions (60, 62, 63, 65), are carried out, preferably as implantation steps.

5. Method according to one off the preceding claims, characterized in that a sidewall oxide (40) is formed on uncovered sidewalls of the gate stacks (GS1-GS8) with diffused first and second doping regions simultaneously being formed below the gate edge.

6. Method according to one of the preceding claims, characterized in that the gate stacks (GS1-GS8) are applied approximately equidistantly with respect to one another, a storage capacitor (TK1', TK2', TK3', TK4') being arranged below every second adjacent gate stack GS1, GS3, GS5, GS7) in the semiconductor substrate (1).

7. Method according to one of the preceding claims 1 to 5, characterized in that the gate stacks (GS1-GS8) are applied approximately equidistantly with respect to one another, a storage capacitor (TK1, TK2, TK3, TK4) being arranged alternately below every third or first adjacent gate stack (GS1, GS4, GS5, GS8) in the semiconductor substrate (1).

8. Method according to one of the preceding claims, characterized in that diffused first and second doping regions are formed by means of a separate heat treatment step set in a predetermined manner.

9. Method according to one of the preceding claims, characterized in that the gate stacks (GS1-GS8) are fabricated with a linear spacing of less than 100 nm.

10. Method according to one of the preceding claims, characterized in that the gate stacks (GS1-GS8) are provided in a parallel, striptype manner on the semiconductor substrate (1).

* * * * *